(12) United States Patent
Zhang et al.

(10) Patent No.: US 9,478,458 B2
(45) Date of Patent: Oct. 25, 2016

(54) WAVEGUIDE AND SEMICONDUCTOR PACKAGING

(71) Applicant: Northrop Grumman Systems Corporation, Falls Church, VA (US)

(72) Inventors: Chunbo Zhang, Manhattan Beach, CA (US); Peter Ngo, Crpress, CA (US); Gershon Akerling, Culver City, CA (US); Kevin M. Leong, Los Angeles, CA (US); Patty Chang-Chien, Redondo Beach, CA (US); Kelly J. Hennig, Torrance, CA (US); William R. Deal, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 109 days.

(21) Appl. No.: 14/149,965

(22) Filed: Jan. 8, 2014

(65) Prior Publication Data

US 2014/0254979 A1 Sep. 11, 2014

Related U.S. Application Data

(60) Provisional application No. 61/775,451, filed on Mar. 8, 2013, provisional application No. 61/775,454, filed on Mar. 8, 2013.

(51) Int. Cl.
*H01Q 13/02* (2006.01)
*H01L 21/762* (2006.01)
(Continued)

(52) U.S. Cl.
CPC ......... *H01L 21/76254* (2013.01); *H01L 23/66* (2013.01); *H01Q 13/02* (2013.01);
(Continued)

(58) Field of Classification Search
None
See application file for complete search history.

(56) References Cited

U.S. PATENT DOCUMENTS 5,995,057 A * 11/1999 Faith ............... H01Q 19/132
333/21 A
7,098,530 B2 8/2006 Jansman et al.
(Continued)

FOREIGN PATENT DOCUMENTS

JP 2001196832 A * 7/2001
JP 2008042899 2/2008
(Continued)

OTHER PUBLICATIONS

Leong, K.M.K.H. et al; WR1.5 Silicon Micromachined Waveguide Components and Active Circuit Integration Methodology; IEEE Transactions on Microwave Theory and Techniques, IEEE Service Center, Piscataway, NJ; US, vol. 60, No. 4, Apr. 1, 2012; pp. 998-1005; XP011439783; ISSN: 0018-9480; DOI:10.1109/TMTT.2012.2184296.
(Continued)

*Primary Examiner* — Charlie Y Peng
(74) *Attorney, Agent, or Firm* — Patti & Malvone Law Group, LLC

(57) ABSTRACT

A method and apparatus for integrating individual III-V MMICs into a micromachined waveguide package is disclosed. MMICs are screened prior to integration, allowing only known-good die to be integrated, leading to increased yield. The method and apparatus are used to implement a micro-integrated Focal Plane Array (mFPA) technology used for sub millimeter wave (SMMW) cameras, although many other applications are possible. MMICs of different technologies may be integrated into the same micromachined package thus achieving the same level of technology integration as in multi-wafer WLP integration.

12 Claims, 13 Drawing Sheets

(51) Int. Cl.
- *H01L 23/66* (2006.01)
- *H01Q 23/00* (2006.01)
- *H01L 23/055* (2006.01)
- *H01L 23/14* (2006.01)
- *H01P 11/00* (2006.01)
- *H01L 23/00* (2006.01)

(52) U.S. Cl.
CPC ........... *H01Q 23/00* (2013.01); *H01L 23/055* (2013.01); *H01L 23/147* (2013.01); *H01L 24/13* (2013.01); *H01L 24/16* (2013.01); *H01L 24/81* (2013.01); *H01L 24/97* (2013.01); *H01L 2223/6633* (2013.01); *H01L 2223/6677* (2013.01); *H01L 2223/6683* (2013.01); *H01L 2224/0401* (2013.01); *H01L 2224/13109* (2013.01); *H01L 2224/16225* (2013.01); *H01L 2224/16235* (2013.01); *H01L 2224/81022* (2013.01); *H01L 2224/81054* (2013.01); *H01L 2224/81191* (2013.01); *H01L 2224/81192* (2013.01); *H01L 2224/81204* (2013.01); *H01L 2224/81805* (2013.01); *H01L 2224/81815* (2013.01); *H01L 2224/94* (2013.01); *H01L 2224/97* (2013.01); *H01L 2924/10329* (2013.01); *H01L 2924/10335* (2013.01); *H01L 2924/12032* (2013.01); *H01L 2924/13064* (2013.01); *H01L 2924/1423* (2013.01); *H01L 2924/14215* (2013.01); *H01L 2924/157* (2013.01); *H01L 2924/15313* (2013.01); *H01L 2924/37001* (2013.01); *H01P 11/002* (2013.01)

(56) References Cited

U.S. PATENT DOCUMENTS

| | | | |
|---|---|---|---|
| 7,504,721 B2 | 3/2009 | Chen | |
| 7,554,504 B2* | 6/2009 | Mohamadi | H01Q 3/34 343/776 |
| 7,683,852 B2* | 3/2010 | Mohamadi | H01Q 21/0006 343/700 MS |
| 8,080,774 B1* | 12/2011 | Guinn | G01S 7/032 250/208.1 |
| 8,278,749 B2 | 10/2012 | Lachner | |
| 8,324,728 B2 | 12/2012 | Tabrizi | |
| 8,350,381 B2 | 1/2013 | Theuss | |
| 2003/0122079 A1* | 7/2003 | Pobanz | H01L 27/14649 250/336.1 |
| 2005/0009226 A1 | 1/2005 | Kumagai et al. | |
| 2008/0029886 A1 | 2/2008 | Cotte et al. | |
| 2011/0140799 A1* | 6/2011 | Biran | H01P 3/121 333/26 |
| 2011/0180917 A1 | 7/2011 | Tang | |
| 2013/0265733 A1* | 10/2013 | Herbsommer | H01P 3/16 361/774 |
| 2015/0122994 A1* | 5/2015 | Yujiri | G01V 8/005 250/336.1 |

FOREIGN PATENT DOCUMENTS

| | | | |
|---|---|---|---|
| JP | 2008182014 | 8/2008 | |
| WO | WO 03029772 A2 * | 4/2003 | ............ G01V 8/005 |
| WO | 2007/149819 | 12/2007 | |

OTHER PUBLICATIONS

Lubecke, V. M. et al; Micromachining for Terahertz Applications; IEEE Transactions on Microwave Theory and Techniques, IEEE Service Center, Piscataway, NJ; US, vol. 46, No. 11; Nov. 1, 1998; XP011037339; ISSN: 0018-9480.

Lan, X. et al; Ultra-Wideband Power Divider Using Multi-Wafer Packaging Technology; IEEE Microwave and Wireless Components Letters, IEEE Service Center, New York, NY; US, vol. 21, No. 1, Jan. 1, 2011; pp. 46-48; XP011341371; ISSN: 1531-1309,DOI: 10.1109/LMWC.2010.2091262.

Katehi, L. P. B. et al; 3-D integration of RF circuits using Si micromachining; Microwave Magazine, IEEE , vol. 2, No. 1, pp. 30-39; Mar. 2001.

Alfonso, E. et al: Gap waveguide components for millimetre-wave systems: Couplers, filters, antennas, MMIC packaging; Antennas and Propagation (ISAP), 2012 International Symposium on; pp. 243-246; Oct. 29, 2012-Nov. 2, 2012.

Suematsu; N. et al; 60GHz antenna integrated transmitter module using 3-D SiP technology and organic substrates; Microwave Conference (EuMC), 2011 41st European; pp. 551-554; Oct. 10-13, 2011.

Stickel, M. et al; High-Q bulk micromachined silicon cavity resonator at Ka-band; Electronics Letters , vol. 37, No. 7, pp. 433-435; Mar. 29, 2001.

Yook; J. et al; Embedded passive and active package using silicon substrate; Electronics Packaging Technology Conference (EPTC), 2011 IEEE 13th, pp. 554-557, Dec. 7-9, 2011.

* cited by examiner

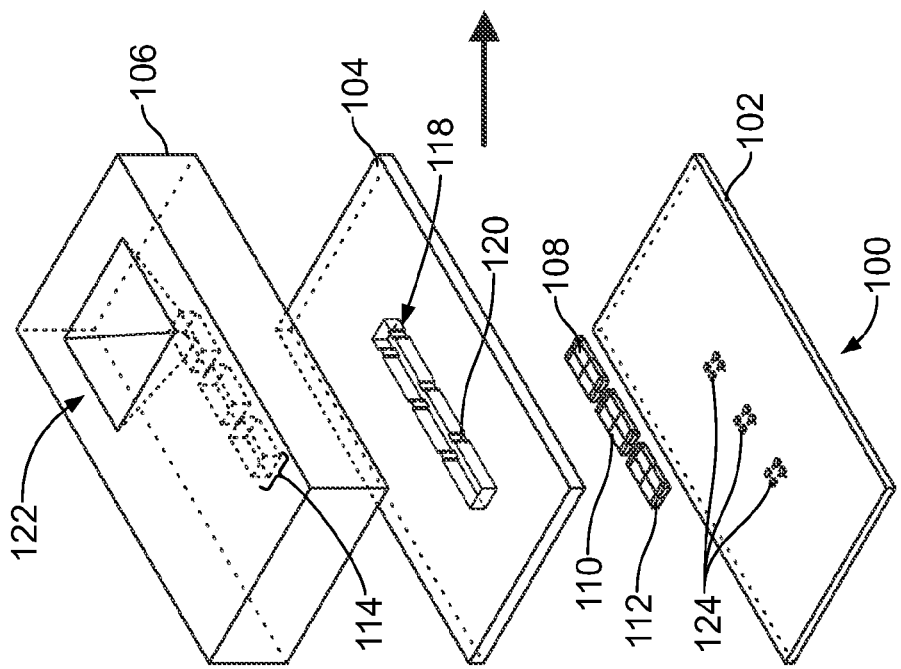
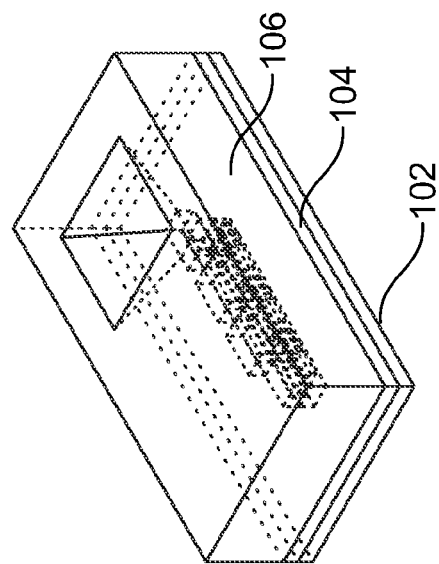
FIG. 2A
FIG. 2B

WAVEGUIDE AND SEMICONDUCTOR PACKAGING

PRIORITY CLAIMS

This application claims priority to U.S. Provisional Application No. 61/775,451, filed Mar. 8, 2013, entitled "WAVEGUIDE AND SEMICONDUCTOR PACKAGING" and claims priority to U.S. Application No. 61/775,454, filed Mar. 8, 2013, entitled "DEEP TRENCH WAFER PATTERNING."

STATEMENT OF GOVERNMENT RIGHTS

This invention was made with Government support under Contract No. W911QX-C-0066 awarded by the Defense Advanced Research Projects Agency. The government has certain rights in this invention.

BACKGROUND

Modern electronic-based imaging systems have a wide variety of uses, including radio telescopes and digital cameras. At a very high level, these devices process wavelengths of electromagnetic radiation to form a composite image. A common device used in such imaging devices is a focal plane array (FPA) of individual antennas, or pixels. The FPA combines radiation from throughout electromagnetic spectrum to form an image.

An FPA is often implemented as a phased array where signals from individual antenna elements are synthesized to form a desired beam, or image. Advanced phased array applications such as the formation of multiple beams, increased resolution at greater distance, and reduced sampling time for imaging systems are achieved by increasing the number of antennas, or the frontend element count. In order for large arrays to be realized, it is preferable to compensate for the increase in element count by a reduction in size, weight and cost so as to keep the overall device within advantageous dimensions. Operating phased arrays at higher frequencies (smaller wavelengths) allows for the reduction in size and weight naturally through utilizing the scaling of components with ever decreasing wavelength. While this has been demonstrated with the relative size of high frequency monolithic microwave integrated circuits (MMICs), this benefit has gone largely unrealized for phased array systems; while the size of the circuits has decreased, fixed aspects of split-block waveguide housing have not led to a reduction of overall system size. Mechanical pins, flange connections, and DC bias have caused the size of a split-block package to remain roughly constant regards of frequency, at roughly 1 in$^3$ from 200-700 GHz.

Recent demonstrations of solid state integrated circuits operating in the deep millimeter wave, sub-millimeter wave, and THz frequencies have provided an impetus towards envisioning imaging systems operating at these frequencies.

Sub-millimeter wavelength (SMMW) imaging systems have the potential to be used for surveillance imaging through airborne obscurants, such as smoke, fog, and dust. SMMW devices operate at frequencies between 0.3 to 3 terahertz (THz). Due to its extremely short wavelength, terahertz radiation can pass through clothing, paper, cardboard, wood, masonry, plastic and ceramics. This makes it ideal for imaging systems that provide discrete detection of remote concealed weapons and improved explosive devices (IEDs).

Current SMMW imaging systems are not practical for battlefield or airborne accommodation due to size and power consumption. One example uses a W-band (75-110 gigahertz) FPA with 1040 elements may be 250 cm$^2$ in size with a total die area of 14,000 mm$^2$, direct current (DC) power requirements of 250 W, a package weight of 15 lbs, and require water cooling. While a SMMW imaging system is desirable, the size is too large for many applications, such as a man-portable system.

Antenna element spacing on the order of a wavelength at the frequency of the system operation is desirable for high frequency compact antenna arrays. Standard waveguide blocks are insufficient to meet these targets. A technology capable of fulfilling the miniaturization promises of high frequencies such as those used for SMMW applications is that of wafer level packaging (WLP), which can bring together different active technologies with etched waveguides in wafer(s) (e.g., silicon, glass, or quartz wafer) for small, dense packages by bonding entire wafers of different wafer substrates. In traditional wafer level packaging, entire active and waveguide wafers are bonded together to create 3-dimensional integrated structures.

Previous advances in wafer level packaging (WLP) allowed for simultaneous integration of waveguide wafer(s) and microwave monolithic integrated circuits (MMICs) wafer(s) to be combined for small size and weight, low loss, and high circuit performance. Despite success from microwave frequencies, to W-band, and even near THz frequencies, some fundamental challenges remain to expanding this type of integration to a robust, low cost process. First, in order to accommodate the waveguide area, the MMIC wafer area is not fully used for MMIC circuits, thus wasting a portion of the expensive III-V semiconductor material which is used mainly as filler to align the active circuits to the SI waveguide. The number of circuits/chips in the wafer is significantly lower than that of regular MMIC wafer since the MMIC circuit area is usually much smaller than the WG area. Second, the device yield is directly linked to the product of the yields of each wafer layer, therefore is affected greatly when the MMIC yield is low. If a functional low noise amplifier (LNA) is matched with a non-functional diode, the entire circuit is non-functional. This problem compounds at higher frequencies where yielding circuits becomes more difficult and testing becomes more costly. Third, in a WLP approach, when the device requires multiple technologies integrated together, the number of wafer layers increases and the device yield decreases quickly with the increasing layer and integration complexity.

Additional hurdles for WLP at sub-millimeter wavelengths are found in the semiconductor manufacturing steps required to achieve the required device density. A common technique used in fabricating semiconductor devices involves the use of photoresists (PR), for example, during the processing and/or patterning of semiconductor wafers. The wafers may be formed from materials such as silicon, III-V compounds, II-VI compounds, or others known to those skilled in the art. Wet photoresists (wet PR) are commonly used, but are often inadequate for patterning wafers that include deep trenches. For example, as trench depth increases to approximately 30-50 μm, the wet PR becomes more difficult to process with acceptable results.

Various issues may be present when using wet PR processes. In one example, sidewalls and/or the bottom of the trench are difficult to be fully covered by the wet PR, leaving them exposed to the subsequent process. Some techniques may help to alleviate these issues if the trench depth is close to, or less than approximately 30-80 μm. Examples of these techniques include multiple wet PR coatings and/or multiple wet PR exposures and development. However even with these techniques, it may be difficult to define accurate patterns and small features.

Another issue with wet PR is a non-uniform PR thickness. Wet PR is typically applied with a spin-coating process, but this commonly results in non-uniform thickness, especially near the edges of a trench. The wet PR thickness may be too thin in some areas while being too thick in other areas with an irregular or unpredictable relationship between coverage location and PR thickness. Where the PR is too thin, the patterns lose their accuracy easily after long or multiple exposures. Where the PR is too thick, it is difficult to fully develop the PR.

Finally, extremely thick wet PR may "pile-up" in some areas, especially when multiple wet PR coatings are used. This pile-up makes it very difficult to develop the wet PR even with multiple PR exposures and development. The pile-up also makes it difficult to define accurate and small features.

SUMMARY

In order to address these concerns, a new integration scheme which relies on integrating individual III-V MMICs into a micromachined waveguide "package" is needed. Using this method, III-V MMICs can be DC screened prior to integration, allowing only known-good die to be integrated, leading to increased yield. This integration method also allows MMICs of different technologies to be integrated into the same micromachined package achieving the same level of technology integration as in multi-wafer WLP integration.

Various implementations of a 330-350 GHz micro-integrated Focal Plane Array (mFPA) technology are described herein, which enable a new generation of SMMW cameras for battlefield use and system enhancement. Implementation at 330-350 GHz using the techniques disclosed allows for a reduction in the focal plane size by up to 13× and a reduction in DC power consumption of up to 25× compared to W-band, along with elimination of the need for water cooling, enabling a compact man-portable aperture. Further, scaling of photo-lithography and die size for this short wavelength allows for a reduction in die area by approximately 28× to reduce unit cost.

While the implementations described herein are related to micro-integrated Focal Plane Arrays, the techniques are applicable to many other wafer fabrication applications. Micro-integration can enable miniaturization of high frequency systems, and can combine different technologies and antennas into small, dense packages. This allows for new products for sub-millimeter wavelength frequencies (focal plane arrays, active imaging, sub-mm radar). When applied to imaging systems, micro-integrated pixels enable large 2D arrays for high frequency imaging, communication, and security systems.

High frequencies reduce the overall optics, camera and electronics size. SWaP Reduction (Size, Weight, and Power Reduction) enables degraded visual environment imaging on multiple platforms. Narrow beam width and limited detector availability enables LPI/LPD communication links. The 2D array of micro-integrated pixels enables dynamic scene imaging and real-time imaging instead of a slower single pixel raster scan. Reduced SWaP enables field portable imaging devices for real time crowd surveillance and weapons detection.

BRIEF DESCRIPTION OF THE DRAWINGS

FIG. 2A depicts a single micro-integrated pixel of a focal plane array.

FIG. 2B depicts composite view of all three wafers of FIG. 2A.

DETAILED DESCRIPTION

Figure 1:
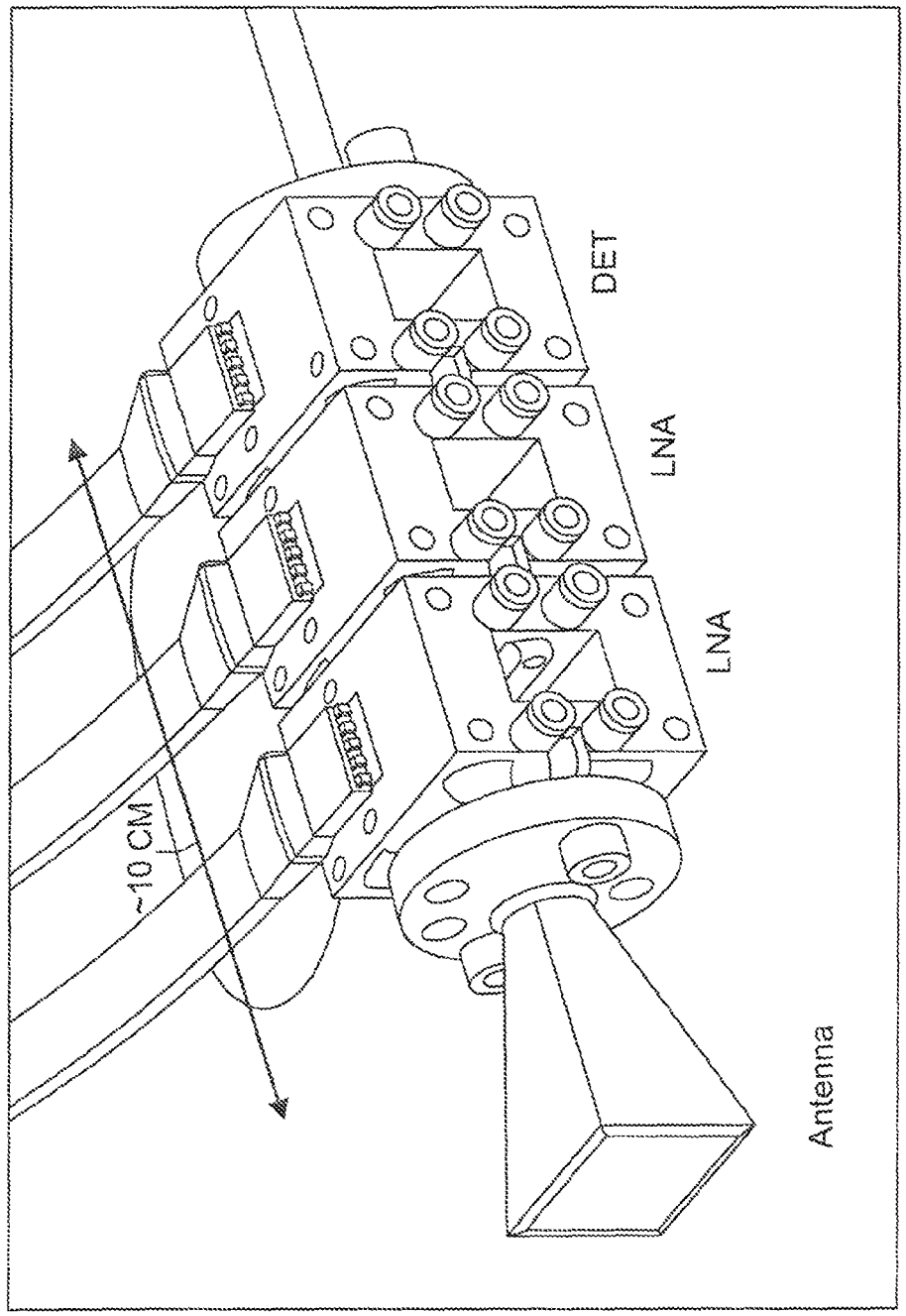
FIG. 1 depicts a prior art view of a single pixel of a focal plane array.

Micro-integration techniques have been used to fabricate a 330-350 GHz receiver pixel which comprises a micromachined horn antenna and waveguides, one or more InP HEMT LNA chips and nIN diode detector. The disclosed technique can be used to manufacture both a single micro-integrated pixel as well as 2D arrays. For comparison, a traditionally packaged 330-350 GHz pixel in a split block package as shown in FIG. 1 may be roughly 10×3×3 cm$^3$, while one example of a micro-integrated pixel as described is approximately 0.5×0.5×0.14 cm$^3$, a volume reduction a factor of >2500. Furthermore, the disclosed micro-integrated pixel volume utilizes a mask layout that could be used for multiple designs. A further 3× volume reduction could be attained by using a more optimized mask layout.

1. Overview

As described herein, silicon or other wafers, for example, glass, may be used as both a package through wafer scale packaging and also used as a waveguide interconnect for multiple chips. Multiple silicon wafers can be combined to form passive silicon waveguide elements. Because the chips are formed separately from the waveguide, different fabrication technologies can be used for the chips and the packaging. For example, specialized chips from a III-V wafer can be integrated within a silicon package and waveguide. The chips may be operatively coupled with the silicon package using solder balls, microbumps, solder microbumps, or copper microbumps. Microbumps are disclosed in X. Zeng, "Wafer Level Bump Technology For III-V MMIC Manufacturing" CS MANTECH Conference, May 17th-20th, 2010, Portland, Oreg., USA, the contents of which are incorporated by reference. The solder balls may provide an electrical DC connection to the outside of the package using hermetic thru-wafer vias. In one example, copper microbumps are formed using 50 µm copper plating with a solder cap. Various sizes of solder balls are possible, but the implementations disclosed herein are based on 3 mil solder balls, or optionally 5 mil solder balls. These features allow for the integration of many different active technologies and also the use of known good active dies.

Turning to FIG. 2A, an overview of a single micro-integrated pixel of a focal plane array is shown as device 100. The device 100 comprises a plurality of wafers 102, 104 and 106 and integrated circuit chips 108, 110, 112. The wafers and integrated circuit chips may be fabricated individually then assembled into a waveguide stack using the techniques described below. Although a single pixel is shown in FIG. 2A, it should be understood that the fabrication processes described below for layers 102, 104 and 106 apply to a wafer with containing multiple pixels arranged in an appropriate layout.

In one example, layer 102 functions as a chip interface layer. This layer includes DC through vias and an output (not shown). Solder balls, or microbumps 124 are placed on chip interface layer 102 for the attachment of chips 108, 110 and 112.

Layer 104 functions as a waveguide layer and includes cavities 118, 120 which are adapted to provide a waveguide 114 for passage of electromagnetic signals. Layer 106 functions as an antenna layer. In the implementation shown in FIG. 2A, the waveguide 114 is formed by cavities in both waveguide layer 104 and antenna layer 106 as shown. In alternative implementations, the waveguide 114 may be formed entirely within the waveguide layer 104, or within the chip interface layer 102 or both. Additional intermediate cavities for the waveguide 114 may be formed by adding additional wafers between the chip interface layer 102 and the cap layer 106. In another alternative implementation, the waveguide layer 104 is omitted and the waveguide 114 is formed only from the chip interface layer 102, only from the antenna layer 106, or from both the chip interface layer 102 and the cap layer 106 in combination.

The integrated circuit chips 108, 110 and 112 in one example comprises monolithic microwave integrated circuits (MMICs). The chips in one example are singulated chips that are positioned inside the waveguide 114. As shown in FIG. 2A, the integrated circuit chips comprise two low noise amplifiers (LNA) chips 108, 110 and a zero-bias detector (ZBD) chip 112. The amplifiers 108, 110 in one example comprise low noise amplifiers. In alternative implementations, the amplifiers 108, 110 may be combined or otherwise formed as a single LNA or other amplifier configuration. The amplifiers 108, 110 may be combined with the detector 112 or with additional integrated circuits (not shown). The chips may also be divided, for example, to provide additional chip features or capabilities. For example, multiple low noise amplifiers can be provided in series or parallel to provide sufficient gain for the device 100. In another example, an amplifier and detector may be combined into a single chip.

FIG. 2B shows a composite view of all three wafers after they are bonded together to form a single pixel. The dimensions are representative of one possible embodiment but other dimensions may be achieved.

Figure 2C:
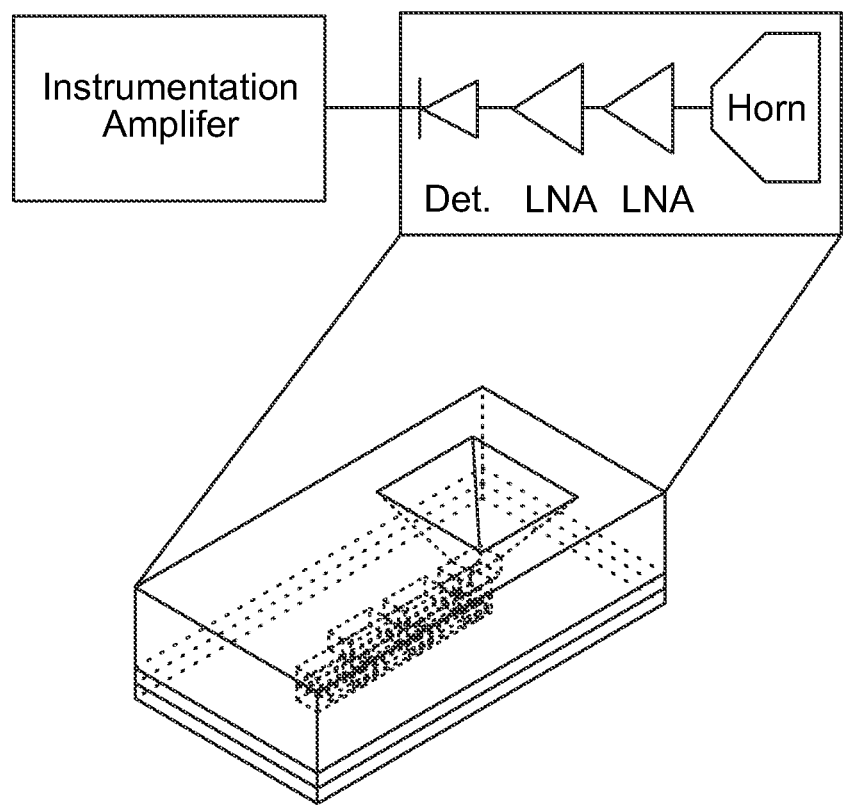
FIG. 2C depicts another view of all three wafers of FIG. 2A.

An electrical circuit diagram of the structure of FIG. 2B is shown in FIG. 2C. SMMW radiation is received through a horn antenna, amplified by a pair of low noise amplifiers, then detected by, for example, a Schottky zero bias detector before being output to additional instrumentation and processing devices. The selection of the two LNA chips and detector may be based on desired characteristics, such as using an LNA with reduced gain where the detector has a sufficiently high responsivity. Alternatively, one or more high gain LNAs may be used to feed a detector with lower responsivity. Either one or a plurality of LNAs may be employed to provide higher gain factors. Alternative implementations of the device 100 may use additional chips.

Figure 3:
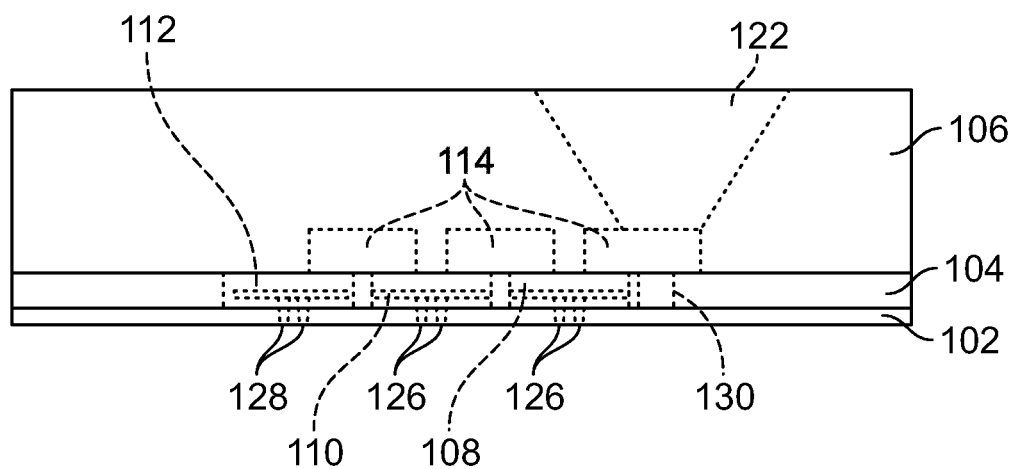
FIG. 3 depicts side view of a single micro-integrated pixel.

FIG. 3 shows a side view of one embodiment of the invention. Chip interface layer 102 includes DC through vias 126 couple to DC pads on the back of LNA chips 108 and 110. An output from ZBD 112 is shown at 128. Waveguide layer 104 includes pockets for holding chips 108, 110 and 112. Waveguide layer 104 also includes a step transition 130 to communicate signals from antenna 122 to LNA 108. Antenna layer 106 includes waveguides 114 and antenna 122.

Each wafer is fabricated individually then combined using wafer scale assembly (WSA) techniques. The fabrication of each layer will be addressed separately, and then their integration with MMIC chips into a complete pixel package will be explained. An overview of the fabrication of complete pixel package is shown in FIG. 4.

2. Chip Interface Layer Fabrication

The fabrication of chip interface layer 102 of FIG. 2A will be described in connection with the first column of the flowchart of FIG. 4 beginning with step 200 together with FIG. 5, which graphically represents the chip interface layer during various steps in the fabrication. At step 202 of FIG. 4, fabrication of chip interface layer 102 begins with a layer of gallium arsenide (GaAs) 340 as shown at 310 in FIG. 5. In a preferred embodiment, GaAs layer 340 is 500-600 µm thick and will be thinned to 100 um thickness. Continuing with step 202, a DC routing traces 342 are patterned on the upper surface of GaAs layer 340.

Figure 4:
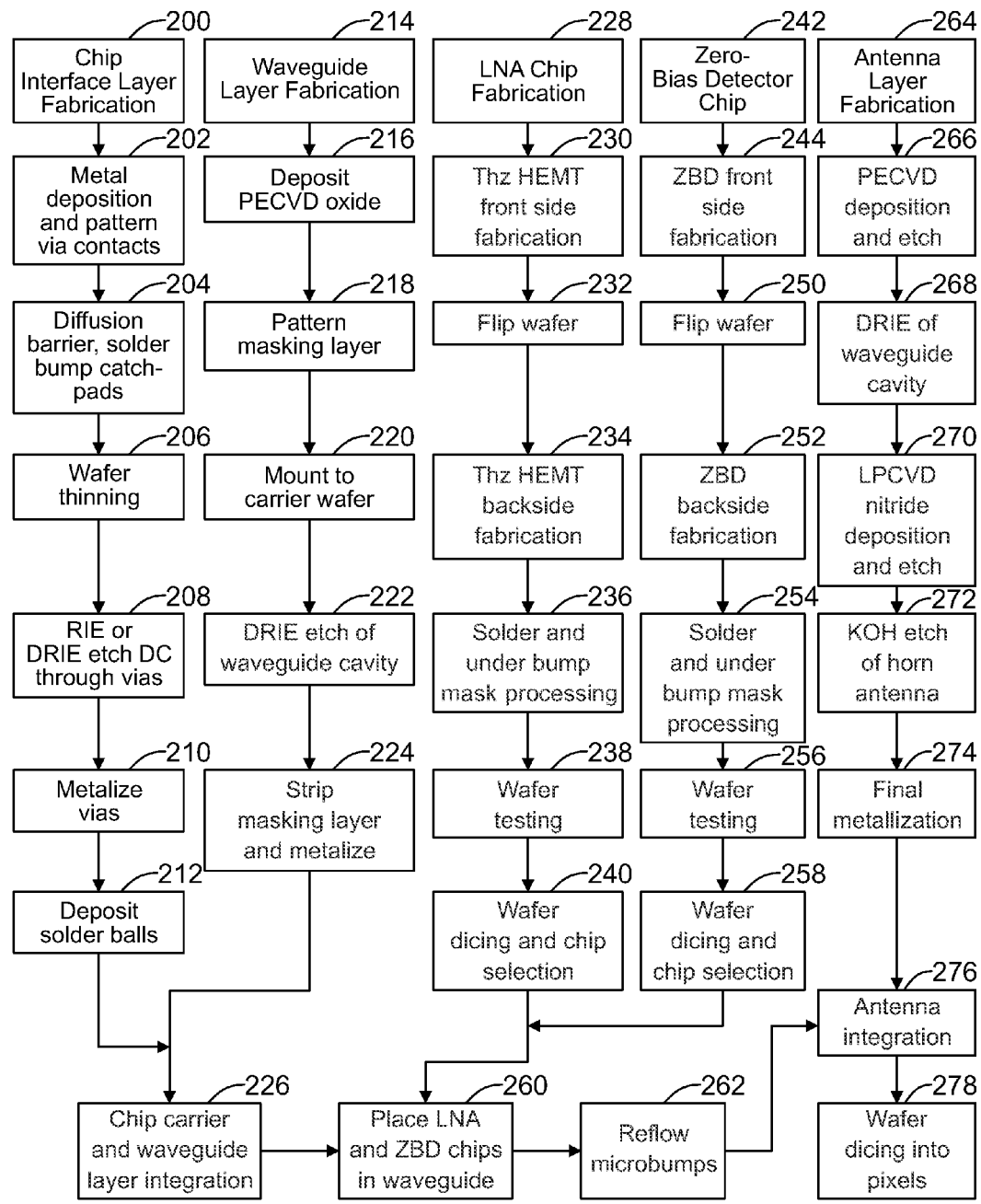
FIG. 4 is a flowchart illustrating the steps involved in fabricating the single micro-integrated pixel of FIG. 2A.

In step 204 of FIG. 4, a dielectric layer (such as silicon nitride) 344 is added at 312 and etched using, for example, -reactive ion etching (-RIE) at 314. Then, diffusion barrier pads 346 for solder balls are added at 316. Pads 346 are made of metals and provide a connection between solder balls and DC routing traces 342.

Figure 5:
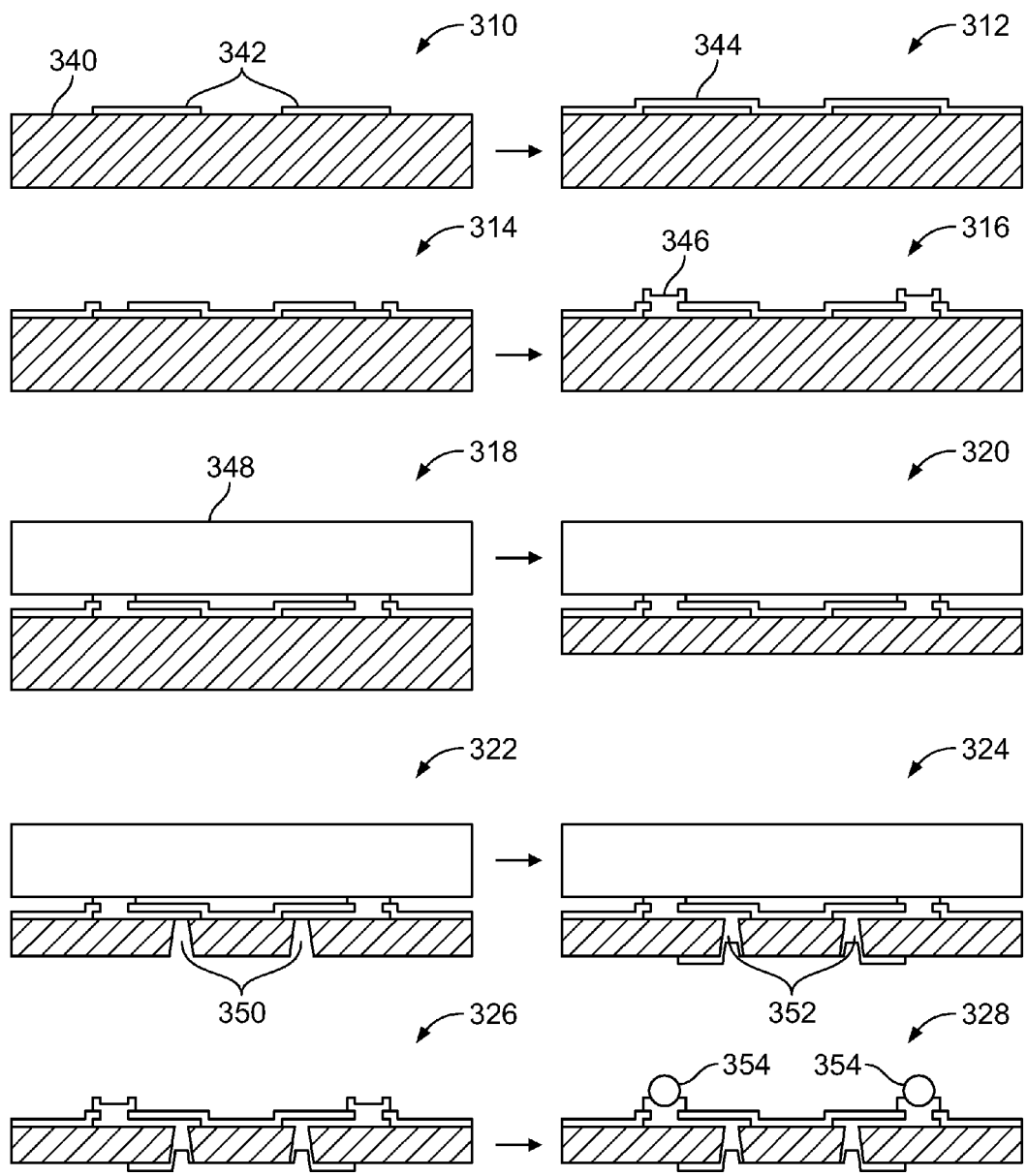
FIG. 5 graphically represents a chip interface layer of the pixel of FIG. 2A during various steps of the flowchart of FIG. 4.

Moving to step 206 of FIG. 5, a sapphire support layer 348 is depicted at 318 of FIG. 5 to support the chip interface layer in a wafer thinning process, depicted at 320.

In step 208 of FIG. 4, DC through vias 350 are etched from the back of GaAs layer 340, depicted at 322 of FIG. 5. DC through vias 350 provide a DC bias to backside DC routing traces 346 for chips 108, 110 and 112 of FIG. 2A. In step 210 of FIG. 4, vias 350 are metalized, for example, with a sputtering process as depicted in 324 of FIG. 5.

Finally, in step 212 of FIG. 4, sapphire layer 348 is removed (326) and solder balls 354 are deposited on the upper surface as shown at 328 of FIG. 5. In a preferred embodiment, solder balls are 3 mil in diameter. In alternative implementations, the solder balls are deposited on the backside of the MMIC chips instead of the interface layer.

3. Waveguide Layer Fabrication

The fabrication of waveguide layer 104 of FIG. 2A will be described in connection with the second column of the flowchart of FIG. 4 beginning with step 214 together with FIG. 6, which graphically represents the waveguide layer during various steps in the fabrication. In step 216 of FIG. 4, plasma-enhanced chemical vapor deposition (PECVD) oxide 384 is deposited on both sides of silicon wafer 382 as shown at 370 of FIG. 6. In a preferred embodiment, silicon wafer 382 has a thickness between approximately 300 μm and 350 μm. Alternative thicknesses will be apparent to those skilled in the art and may be based on desired parameters. At 372 of FIG. 6, the oxide on the upper portion of the silicon layer 382 is etched using, for example, a RIE process as described in step 218 of FIG. 4. Specific details concerning the fabrication of waveguide layer 104 will be given below in connection with FIGS. 12-15.

Figure 6:
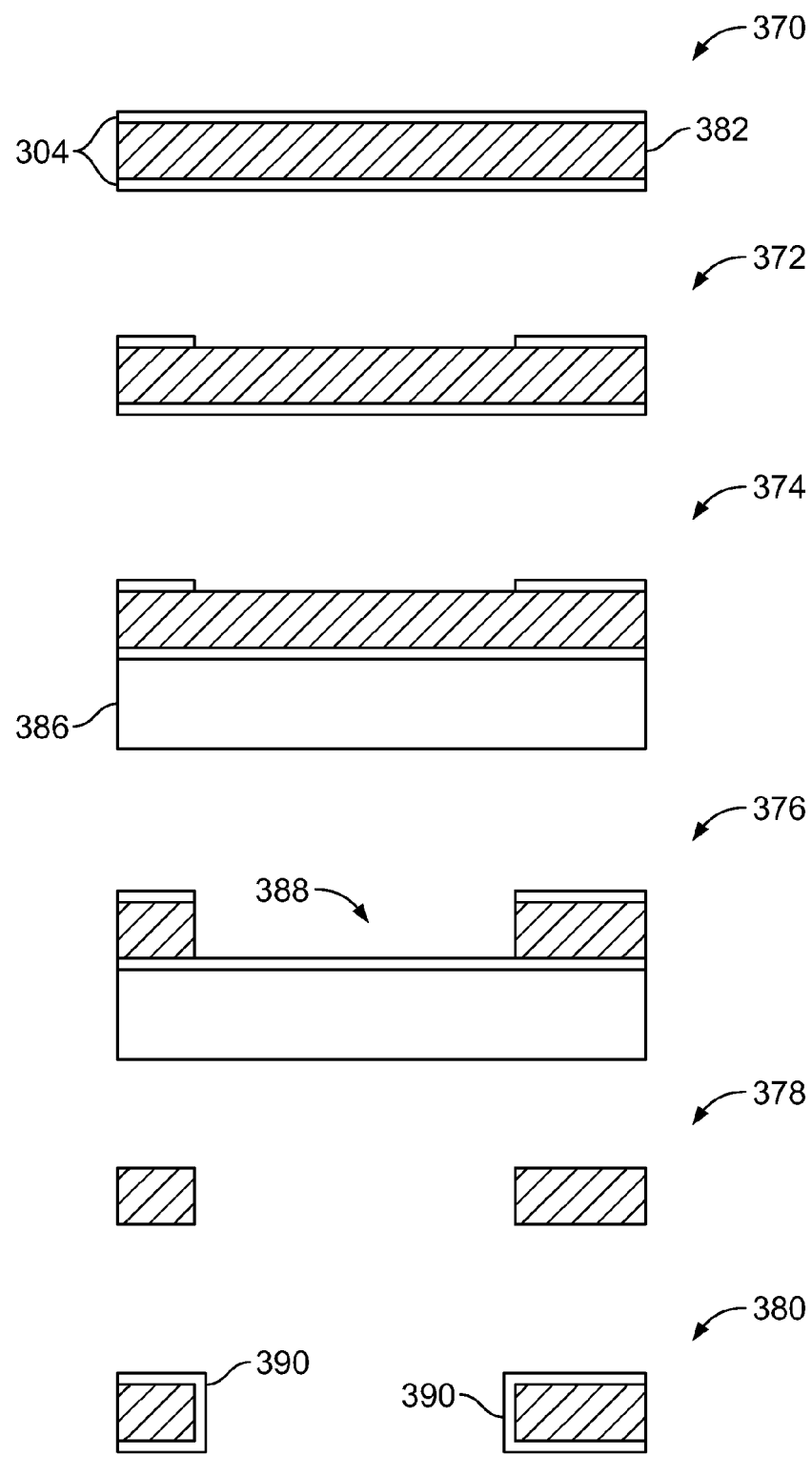
FIG. 6 graphically represents a waveguide layer of the pixel of FIG. 2A during various steps of the flowchart of FIG. 4.

In step 220 of FIG. 4, the waveguide layer is mounted to carrier wafer 386 as shown at 374 of FIG. 6, while in step 222, a waveguide cavity 388 is etched using, for example, a DRIE process as shown at 376. The waveguide layer may be adapted to provide one or more of waveguides, step transitions, and/or chip cavities.

Finally, in step 224 of FIG. 4, the masking layers are removed as depicted 378 of FIG. 6 and the waveguide cavity is metalized, as shown at 380. Metallization of the waveguide sidewalls allows for low loss wave propagation of less than 0.2 dB per millimeter.

4. LNA and ZBD Fabrication Overview

In general, one or more of the chips 108, 110 and 112 of FIG. 2A may be formed from III-V semiconductors, such as GaAs or InP. Alternative wafer materials will be apparent to those skilled in the art and need not be the same for each chip used in the device 100. Specific processing details for LNA and detector chips will be discussed below. In general, during processing of the "front side" of the wafer to create a plurality of chips, one or more "hot via" interconnects are added to bring DC to the frontside of the chips from their backside or to provide video signal.

The HEMT device technology provides a sub-50 nm transistor gate length for modulating an InAs Composite Channel (IACC). This structure has demonstrated maximum oscillation frequencies $f_{MAX}>1.4$ THz and maximum cutoff frequency $f_T>700$ GHz. The process has scaled passive components to support increased operation frequency, such as 600 pF/mm² Metal-Insulator-Metal (MIM) capacitors, 20 and 100Ω/□ thin film resistors (TFRs), two layers of interconnect with airbridge option, and device passivation. The wafer is thinned down to 50 μm with compact backside vias to suppress substrate modes.

a. Low Noise Amplifier (LNA)

The fabrication of LNA chips 108 and 110 of FIG. 2A will be described in connection with the third column of the flowchart of FIG. 4 beginning with step 228 together with FIGS. 7A and 7B. At step 230 of FIG. 4, fabrication begins with THz HEMT processes on the front side of a III-V semiconductor, such as GaAs or InP. Then, at step 232, the wafer is flipped so that back side THz HEMT fabrication can be performed.

Figure 7A:
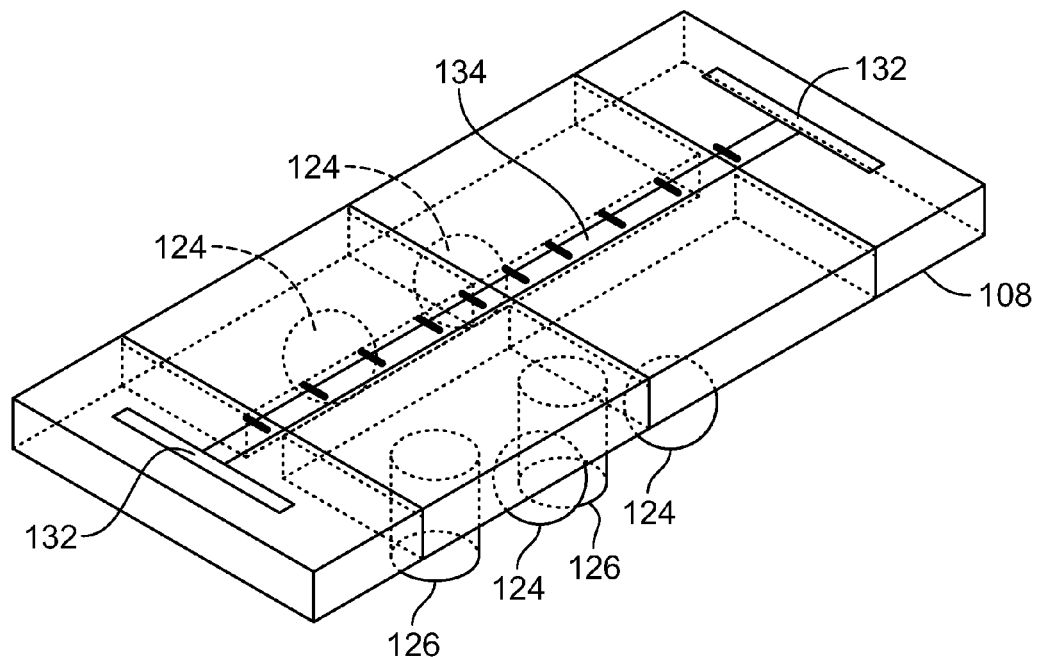
FIG. 7A depicts an LNA chip.

The LNA in one example uses a coplanar waveguide 134 and employs on-chip electromagnetic dipoles 132 to transition energy into and out of the waveguide, as shown in FIG. 7A. To fit inside the cavities in waveguide layer 104, in a preferred embodiment the chip size is constrained to less than 775 μm×350 μm, which allows only a single bias pad each for all the drain and gate voltages shown at 126 of FIG. 7A. Over the operating band of 330-350 GHz while consuming ~15 mW of DC power, the LNA achieves a gain of ≥15 dB and noise figure (NF) of <10 dB.

A LNA implemented in the invention can be, for example, a 3 stage or a 5 stage amplifier. The 3 stage amplifier provides less gain than the 5 stage. However a certain overall gain is needed for the system thus requiring two 3-stage amplifiers to make this gain requirement but only one 5 stage amplifier. In general, using just one amplifier chip is favorable since it requires less space but any configuration can be used to meet system requirements.

The LNA 142 in one example comprises a 5-stage high gain LNA sub-millimeter-wavelength monolithic microwave integrated circuit (S-MMIC). The primary considerations of the LNA size are the number of stages, desired gain, impedance matching networks, and bypass capacitors for oscillation suppression. To avoid dicing damage to solder balls and/or active circuitry of the LNA, spacer posts may be used. In addition, full chip singulation may be used to eliminate scribe/break conditions.

The LNA 142 in one example comprises 30 nm Indium Phosphide high electron mobility transistors (HEMT). HEMTs generally allow for a high $f_{max}$. The LNA 142 is adapted to provide an integrated transition to the waveguide 130. Measured packaged performance of one implementation of the LNA 142: Packaged gain ~17 dB from 320 to 350 GHz, NF<8.8 dB, LNA DC power $P_{dc}=14.3$ mW, loss per transition ~1 dB.

Additional completed 30 nm InP HEMT LNAs have shown gain and noise figure (~5.7 dB at MMIC level) at 330 GHz with high RF yield (>80%).

In another implementation, two 3-stage LNA S-MMICs were used to provide 30 dB gain (15 dB each) and <8 dB NF for SMMW imaging. Each 3-stage LNA was 270×275 μm². This LNA size is compact enough to fit within a 3λ spacing goal. One wavelength at 340 GHz corresponds to a coplanar waveguide (CPW) line length of ~360 μm.

Where five gain stages are incorporated into a single LNA, a desired gain (e.g., 30 dB) may be achieved while eliminating a 50 μm length of waveguide and two on-chip waveguide transitions. For example, a five gain stage LNA in one example is 430×275 μm². This size meets both the 2λ and 1.5λ spacing rules.

To avoid potential oscillation caused by the high gain of the LNA 108, 110, in one example a lossy resistive cover material may be applied to the inner surfaces of the waveguide 114 in order to minimize feedback in the waveguide 114. The lossy resistive cover material in one example is Nickel Chromium.

At step 236 of FIG. 4, a number of backside processing steps can then be taken to improve adhesion of the chips to chip interface layer 102. For example, the chips may be deposited with a solder mask on their backside or have a diffusion barrier applied. The solder mask in one example provides containment and definition for the solder material (solder balls), shown at 124 in FIG. 7A. As one alternative to the use of solder balls, "microbump" plating may be used. In this case, subsequent to the solder mask deposition, an under bump mask (UBM) deposition may be performed along with 2 mil microbump plating. The solder mask and UBM deposition in one example are also performed on the chip interface layer 102. Other processes that may be used include a via etch process, backside metallization process, and processes for preparation of the solder pads.

At step 238, the chips on a fabricated wafer may be screened after processing to determine their functionality. Screening may be performed "on-wafer" or after dicing. After screening, the chips may be diced, inspected, and picked for further integration with the device 100 at step 240.

b. Transitions from Waveguide to Chips

Figure 7B:
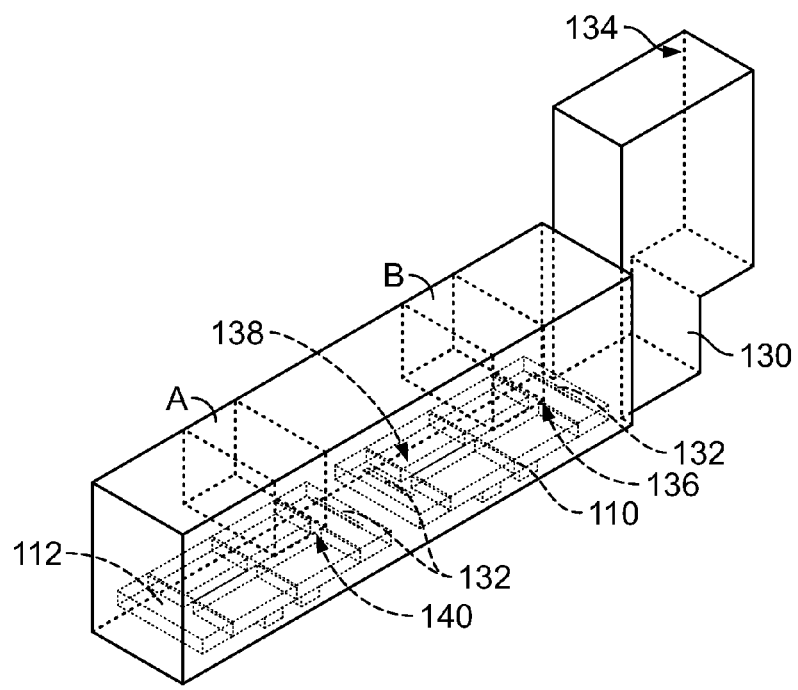
FIG. 7B depicts the transitions between waveguides and LNA/ZBD chips in the pixel of FIG. 2A.

The LNA and detector chips will be coupled to the DRIE formed waveguide using integrated electromagnetic transitions, as shown in FIG. 7B. An E-plane probe will be used as a low interconnect between horn antenna 122 of FIG. 1A and LNA chip 110 as shown in FIG. 7B. This will allow for tight integration to minimize component-to-component spacing, which is essential for array scalability. The distance between MMICs is minimized to realize a compact pixel size and provide minimal interconnect loss.

The interconnect between horn antenna 122 and MMIC chips in one example comprises a cavity within the waveguide. In alternative implementations, the interconnect may comprise conductive connections. A first interconnect 130 of FIG. 7B includes a 90° waveguide bend and has an insertion loss of ~1.2 dB. The second interconnect 132 has a loss of ~2.4 dB (including two chip to waveguide transitions). The interconnects in one example comprise high tolerance electromagnetically coupled interconnects which allow for elimination of bond wires and narrow pitch interconnects to provide for increased yield and uniformity.

At high frequencies (>70 GHz), MMIC amplifiers present challenges when using wire-bonds as a method for transferring electromagnetic energy. At these frequencies wire bonds contribute significant insertion loss and highly reactive impedances which can detune the MMIC.

Interconnect 132 is integrated directly to the active MMIC. Therefore it is much less sensitive to assembly variations and leads to increased yield and uniformity. Interconnect 132 electromagnetically couples to the MMIC to the waveguide.

c. Zero-Bias Detector (ZBD)

As shown in steps 242-258 of FIG. 4, ZBD chip 112 is fabricated similarly to the LNA chips. In a preferred embodiment, ZBD 112 uses a nIN pseudo-Schottky diode which provides unbiased mixing, multiplying and direct detection of microwave and millimeter-wave signals. In one example, the detector 112 is a "zero-bias diode" which eliminates the need for a detector circuit bias. This simplifies the overall system and reduces the system noise. One example of a diode is disclosed in Sawdai, et al. (U.S. Pat. No. 8,334,550), the contents of which are incorporated by reference. In this approach, a highly-doped n+ narrow bandgap layer (such as InGaAs) replaces the anode metal in a standard Schottky diode. Therefore, the effective Schottky barrier is an epitaxial grown heterojunction between the n+ anode layer and the low-doped cathode layer. The heterojunction can be tailored to produce a desired barrier height, thus allow tuning of the diode turn-on voltage. Initial results have demonstrated that the n-I-N pseudo-Schottky diodes are readily fabricated, scalable to high frequencies, and sufficiently rectifying at 0 V for use as a zero-bias detector. The diode provides a cut-off frequency $f_C$ of up to 520 GHz, and more preferably up to 740 GHz. An unbiased direct detector circuit using these nIN diodes has demonstrated a responsivity of >3000 V/W for incident RF at 195 GHz (FIG. 20). The simulated detector responsivity is ~1400 V/W for 340 GHz incident RF signal.

The epitaxial stack of this nIN unipolar diode that is comprised of a n+ highly doped wide bandgap subcathode semiconductor layer, a low-doped wide bandgap cathode layer, and a n+ highly doped narrow bandgap anode layer. The heterojunction between the cathode layer and the anode layer creates a small and high quality electron barrier in the conduction band. This barrier creates current rectification with a tunable turn-on voltage. In one example, lattice-matched $InGaAs/InAl_xGa_{1-x}As$ alloyed semiconductor on 100 mm InP substrates are used. The composition of the materials in the anode and cathode layers is designed to produce a low forward turn-on voltage. Mesa diodes were fabricated with various areas ranging from 1 to 10 $\mu m^2$. Similar to the LNA, the final substrate thickness is 50 $\mu m$. This nIN diode technology has demonstrated a peak $\gamma \sim 27$ $V^{-1}$ and cut-off frequency up to 520 GHz. The figures of merit achieved with these novel nIN unipolar devices are comparable with other zero-bias Schottky diodes.

5. Chip Carrier/Waveguide Assembly

Figure 8:
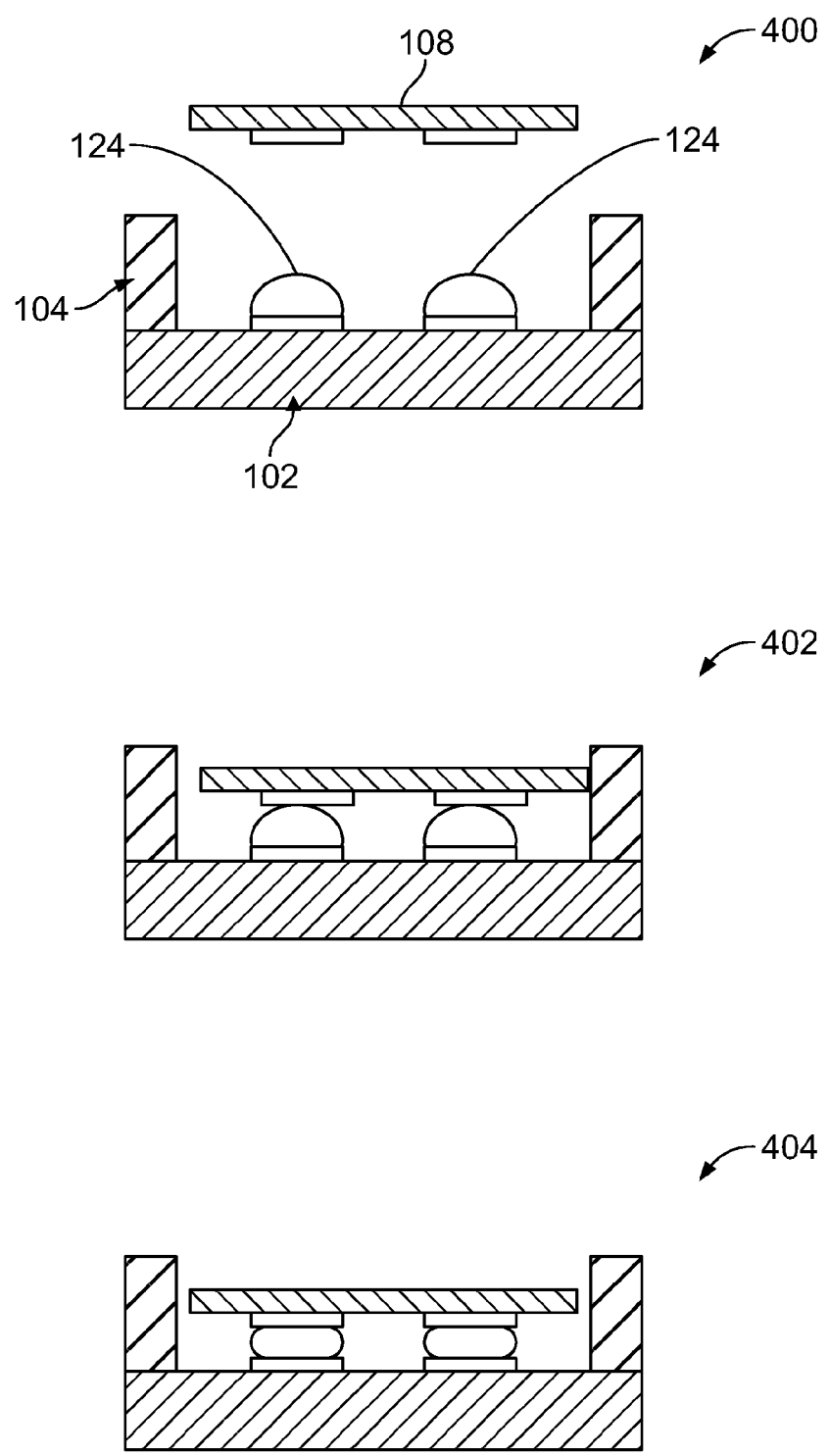
FIG. 8 graphically represents an integration of chip interface and waveguide layers with MMIC chips during various steps of the flowchart of FIG. 4.

As shown in step 226 of FIG. 4, a first step in assembling the micro-pixel involves bonding waveguide layer 104 to chip interface layer 102 as shown at 400 in FIG. 8. A low temperature bonding process is used to minimize heat exposure to the solder balls, for example, indium-Au bonding or Au—Au thermocompression bonding.

Bonding temperature and surface topology of the wafers are relevant parameters for integration of the multiple wafer technologies. A solder ball reflow (described below) temperature should be higher than the wafer bonding temperatures to prevent solder reflow during wafer bonding. In one example, an indium-gold bonding interface is used for bonding the wafers, along with a solder that melts at approximately 183 C. Indium melts at 157 C and the indium-gold bonding allows for a bonding temperature lower than 180 C (170 C in the actual bonding). Alternative solders, bonding materials, and bonding methods will be apparent to those skilled in the art. One or more of the layers 102, 104 and 106 are patterned with gold and/or indium to promote the wafer bonding.

Next, at step 260, singulated, known-good LNA and ZBD chips are placed in cavities 388 (FIG. 6) of waveguide layer 104, as shown at 402 in FIG. 8. The chips 108, 110 and 112 are coupled with the chip interface layer 102 by a plurality of solder balls 124. The solder balls in one example are sized based on the chips to which they attach. In a preferred embodiment, 5 mil and 3 mil solder balls are used, but other sizes are contemplated. The gross chip alignment to the chip interface layer 102 is approximately 25 $\mu m$, defined by the cavity boundaries. The cavity sizes and/or chip shape may be adjusted to promote chip placement within the cavity. For example, the chips may be rectangular shaped or cross shaped or the cavity size may be increased to simplify chip placement. The microbump reflow step can then self-align the chips to the carrier pads up to within approximately 1 to 2 $\mu m$.

Then, at step 262 of FIG. 4, the process of microbump self-alignment is performed by solder reflow so that chips are aligned within the cavities as shown at 404 of FIG. 8. The solder reflow for chip attachment after the first bonding of chip interface layer 102 and waveguide layer 104 should not damage or cause a shift in the bonding of the interface layer 102 and waveguide layer 104. In one example, the In—Au layer of the first bonding forms a eutectic/alloy and thus needs a higher temperature to reflow again. Solder reflow in one example is performed at a desired temperature, for example approximately 200 C, with lower temperatures being preferable. The solder reflow in one example is performed by gradually heating ("ramp up") the solder balls to the desired temperature, optionally holding at the desired temperature for a hold time period, then reducing heat ("ramp down"). The duration of the ramp up, hold time period, desired temperature, and ramp down may be adjusted. In one example, the ramp-up is approximately 1-2 minutes, 200 C is held for approximately three seconds, and the ramp-down is approximately 1-2 minutes. Low heating temperatures and short heating durations will generally reduce solder diffusion through the barrier layer in solder pads. In one example, the actual wafer/chip bonding time is only 2-10 minutes and maximum ramping is used.

Because of the solder balls on top of the chip interface layer 102 (>50 μm tall on surface), the first wafer bonding needs sufficient height clearance during wafer alignment to avoid damage or displacement to the solder balls. Higher accuracy in wafer alignment allows for reduction in the spacing between the chips 108, 110 and 112 and the walls of the waveguide 114, which reduces signal losses. In one example, a SmartView aligner (EV Group Inc., Tempe, Ariz. 85284) may be used to achieve an alignment accuracy of approximately 1 μm.

Solder may be easily oxidized in an air environment. The oxide prevents liquid solder from wetting and forming a joint with the other component (e.g., the chip interface layer 102 and/or chips 108, 110 and 112). In one example, the solder, wafer, or chip is rinsed using a liquid flux to remove the oxide shortly before the solder reflow. The reflow in one example is performed in a controlled air environment, for example, in an $H_2$/Ar mixture.

In a further embodiment, microbump self-alignment is promoted by increased solder material on a copper stud and/or increases in microbump size. Wettability of the solder to the carrier wafer pads may be improved by selection of the under bump metal (UBM) for the MicroBump. Examples of the under bump metals include copper, gold, and copper with a solder cap. The choice of under bump metal (UBM) and solder mask material as well as bonding pad size and spacings will determine the accuracy of self-alignment during solder reflow. In the above implementation, self-alignment accuracy is approximately up to 1 to 2 μm.

One advantage of bonding the waveguide layer first as described above is that the cavity sidewalls provide for coarse alignment of the chips as they are placed into position. In alternative implementations, LNA and ZBD chips can be placed and bonded to the interface layer first, then the waveguide layer is bonded to the interface layer.

6. Antenna Layer Fabrication

The fabrication of antenna layer 106 of FIG. 2A will be described in connection with the last column of the flowchart of FIG. 4 beginning with step 264 together with FIG. 9, which graphically represents the antenna layer during various steps in the fabrication. In step 266 of FIG. 4, a 1 mm thick wafer of silicon 424, for example, a plasma-enhanced chemical vapor deposition (PECVD) oxide 430 is deposited on an underside of silicon wafer 424, as depicted at 410 of FIG. 9. Oxide 430 is etched as shown at 412.

Figure 9:
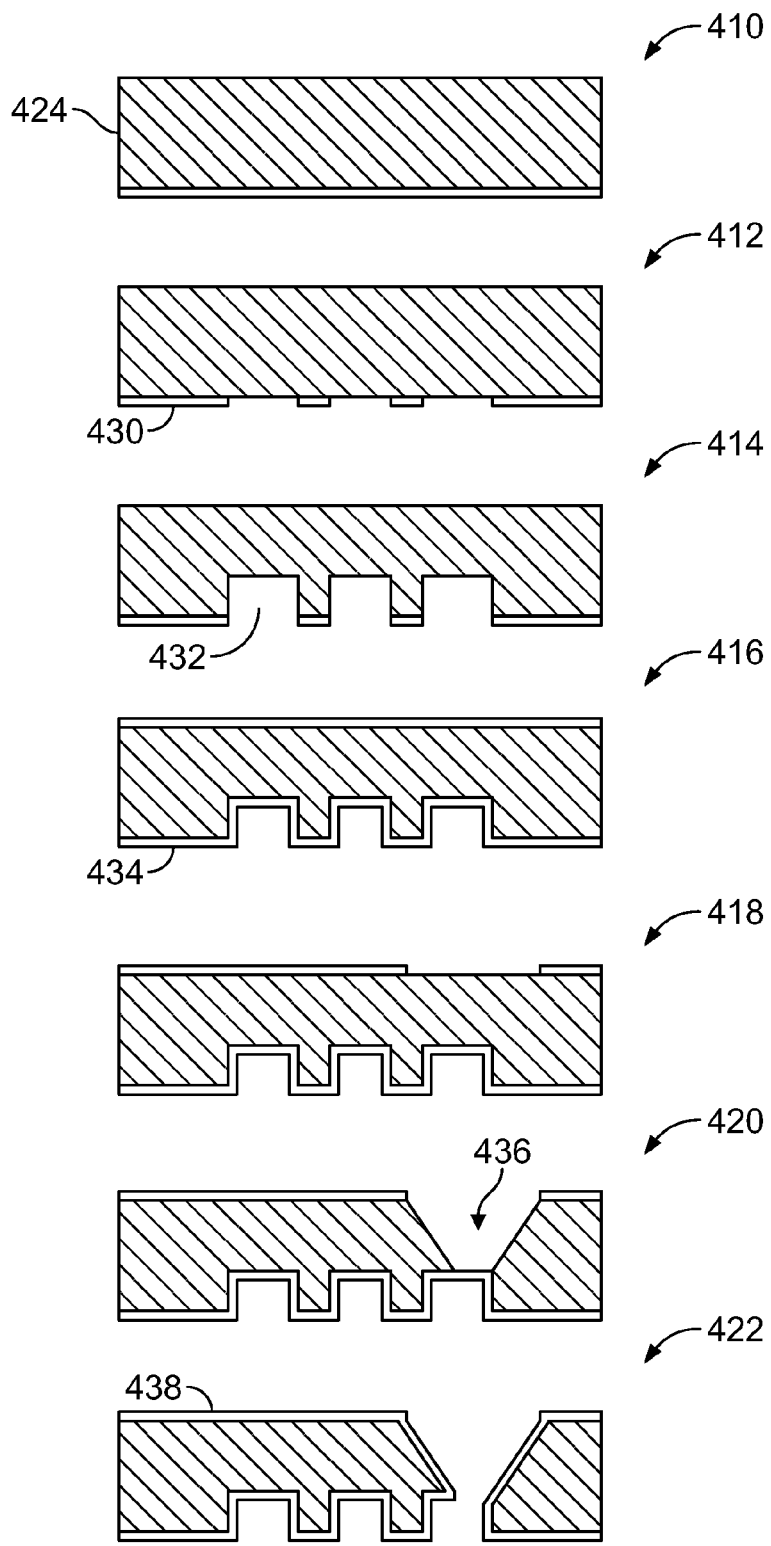
FIG. 9 graphically represents an antenna layer of the pixel of FIG. 2A during various steps of the flowchart of FIG. 4.

In step 268 of FIG. 4, a waveguide cavity is formed in the antenna layer using, for example, a DRIE process as shown at 414 of FIG. 9. In step 270 of FIG. 7, a low pressure chemical vapor deposition (LPCVD) process, for example, is used to deposit nitride layer 434 so as to protect waveguide sidewalls and create a masking layer for a horn antenna as depicted at 416 and 418 of FIG. 9. In a further example, thermal oxidation is used for the horn etch mask instead of LPCVD nitride. A lossy cover (e.g., Nickel Chromium) may be provided on antenna layer 106 by deposition and patterning of nickel chromium, for example, on the inner surface of the waveguide 432.

In step 272, a horn antenna 436 is formed by, for example, potassium hydroxide (KOH) etch as shown at 420 of FIG. 9. KOH etching results in smooth sidewall surfaces with a slope of approximately 54°. Horn antenna 436 is etched to have a depth of approximately 800 μm. Finally, in step 274 of FIG. 7, the nitride layer is stripped and the antenna layer is metalized, for example, by a sputtering process, as shown at 422 of FIG. 9. In alternative implementations, steps 270 and 272 in FIG. 4 are performed before steps 266 and 268 to form the horn antenna cavities first.

Advantageously, integration of horn antenna 436 into the antenna layer reduces a signal path of input electromagnetic signals. Horn antennas are preferred because they provide a highly efficient radiator (~80-90%) compared to planar or patch antennas, have excellent bandwidth (S11<−10 dB from 300-360 GHz, 18%) compared to 1-2% for planar or patch antennas, and excellent gain. However, alternate forms of antennas are contemplated. In a preferred embodiment, the antenna has a gain of 12 dB, 3 dB beam widths and 32×38 degrees.

In one embodiment, antenna 436 is filled with benzocyclobutene (BCB) to increase dielectric allowing for a reduction in size of antenna 436. Alternative fillers will be apparent to those skilled in the art. Further, antenna 436 may be formed using a stepped photoresist approach and/or a multi-wafer approach. In one example, the sloping sidewalls of horn antenna 436 are created by grayscale photolithography followed by DRIE. This lithography process involves the use of varying the size and pitch of sub-micron pixels that are not resolvable by the photo resist. This creates a gradient exposure that translates to an inclined photoresist profile. During DRIE etch the photoresist profile is translated to the silicon etch. Following the etch process, the antenna sidewalls are metalized with gold (Au). Alternatively, a KOH etch may be used to form the antenna 436, as described above.

7. Final Assembly Steps

In step 276 of FIG. 4, antenna layer 106 is bonded to waveguide layer 104 with a In/Au bond or Au/Au thermocompression bond. Additional metal film (such as indium) may need to be added to layer 104 or 106, whose process will be described in section 9 below. Finally, in step 278 of FIG. 4, the assembled layers are diced into individual pixels.

Figure 10:
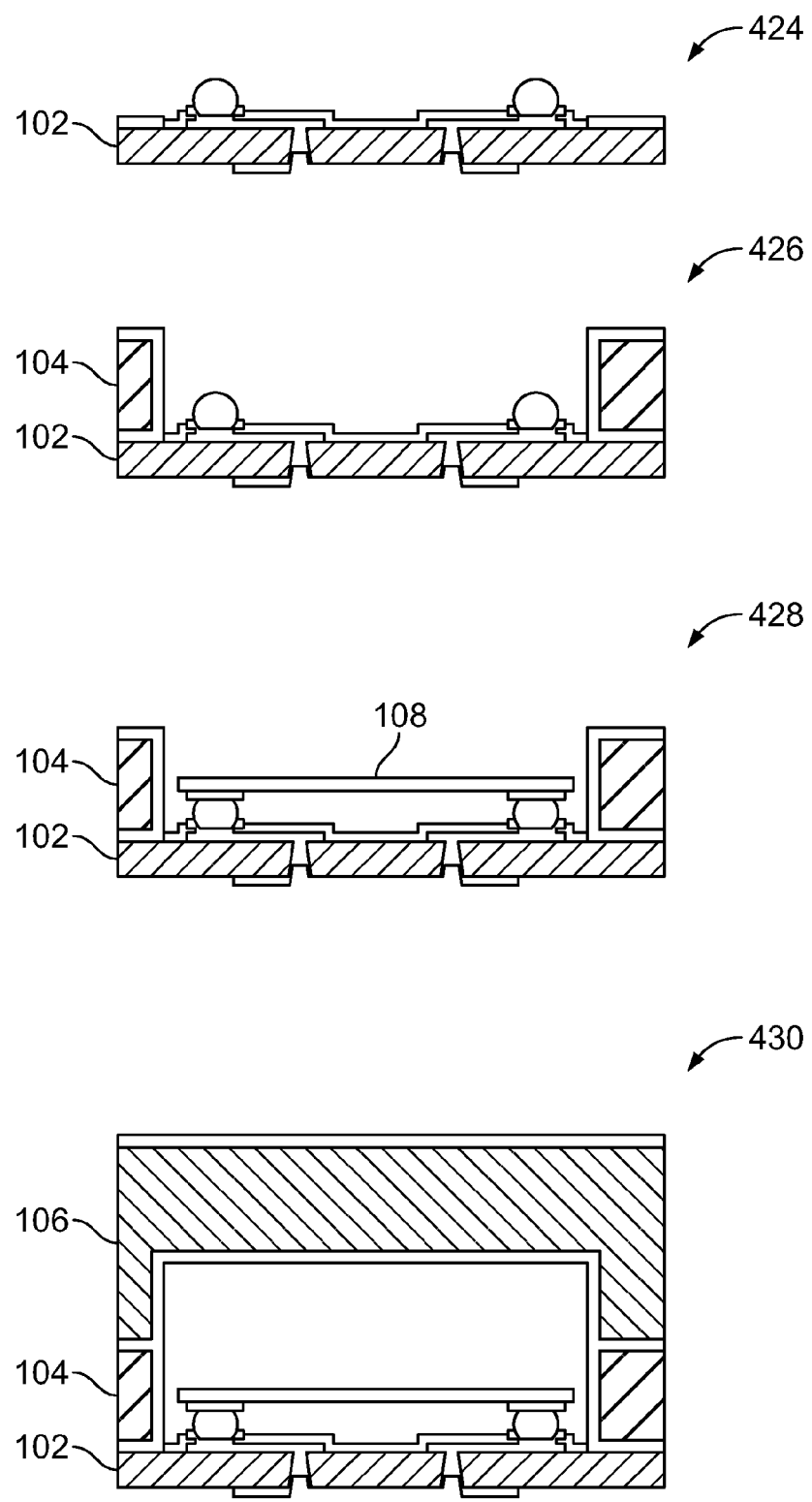
FIG. 10 graphically represents the overall assembly of pixel of FIG. 2A.

FIG. 10 graphically represents the overall assembly of a focal plane array pixel according to the present invention. Chip carrier layer 102 is shown at 424, with DC vias and solder balls. At 426, waveguide layer 104 is bonded to chip carrier layer 102 as explained above and shown in FIG. 4, step 226. At 428, MMIC chips 108, 110 and 112 are placed in cavities of waveguide layer 104 and bonded as shown in step 260 of FIG. 4 and described in connection with FIG. 8. Finally, at 430, antenna layer 106 is bonded to waveguide layer 104.

8. Wafer Scale Processing of Focal Plane Array

The integration approach and features described herein allow for batch fabrication of chips and waveguides with different wafer technologies. Integration of chips fabricated in different semiconductor technologies and connected through low-loss micromachined waveguide transitions enables improved element performance. As applied to the mFPA implementation described herein, a fully integrated 330-350 GHz focal plane array in a triangular lattice 2-D sub-array with known-good chips may be fabricated, providing high density, micron precision integration of the LNA, detector, and antenna in a micro-scale pixel. The mFPA shown in FIG. 2A has been fabricated with a size of approximately 0.4 cm×0.18 cm×0.135 cm.

The use of micromachining for the waveguides reduces the layer count. The advantages provided allow for scaling to large planar arrays of up to 1024 elements and more, reduced compound yield issues associated with some wafer level packaging approaches, and the use of a single III-V wafer for multiple Silicon Packaging wafer runs. The advanced packaging and resistive cover over the LNA S-MMIC provides for increased stability. The electromagnetically coupled cross-shaped chips allow for low loss interconnects.

Figure 11:
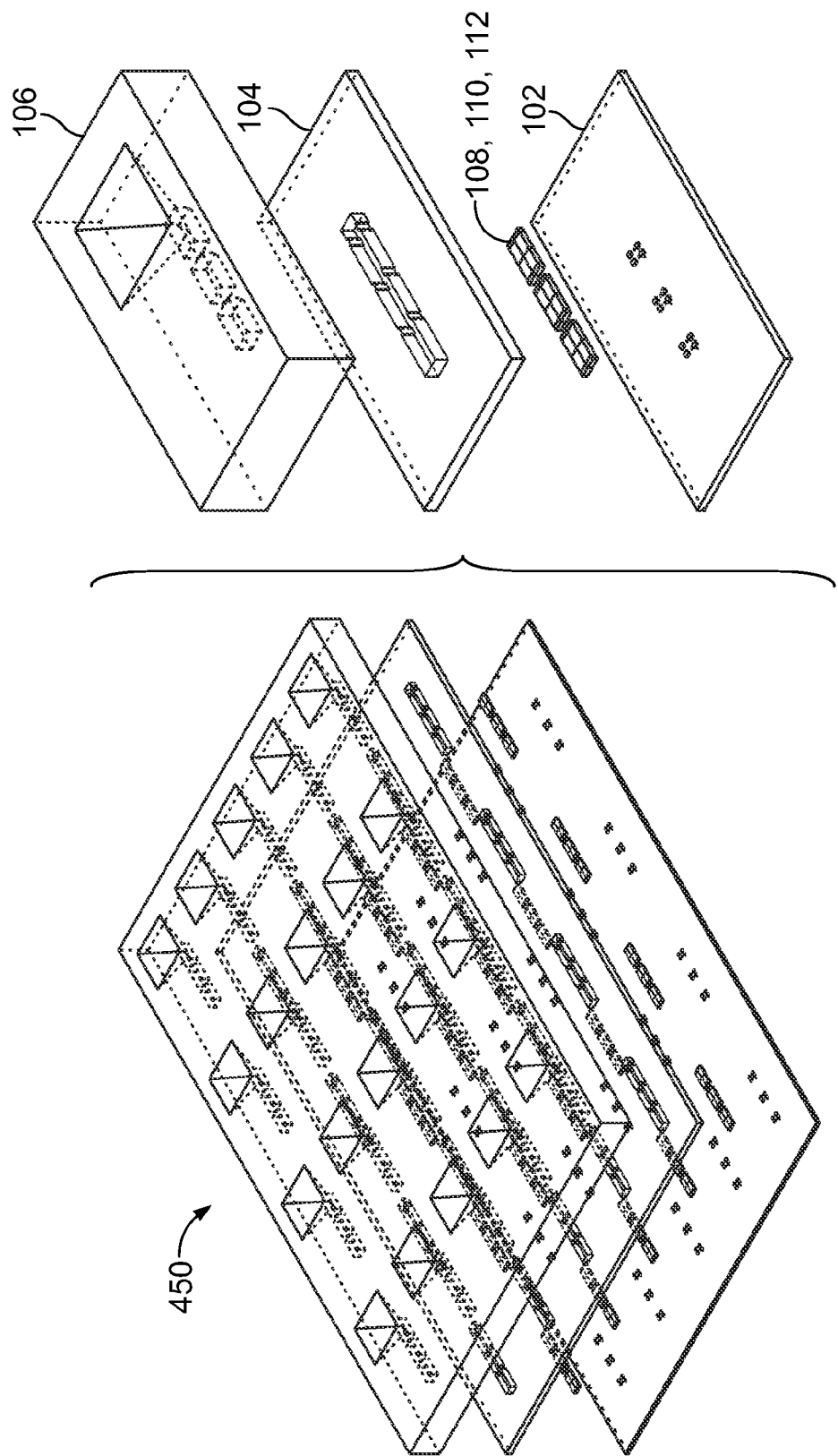
FIG. 11 depicts an array of mFPA pixels as shown in FIG. 2B.

An example of a large planar array of mFPA pixels is shown in FIG. 11. The planar array is shown on the left at 450 as comprising a plurality of pixels each having layers 102, 104 and 106 and chips 108, 110 and 112 as shown on the right side of FIG. 11. The specific layout of pixels shown in FIG. 11 is not required and any suitable layout may be chosen to achieve the most favorable number of pixels, signal loss between components and other factors. The use of a large scale planar imaging array allows for dynamic scene imaging.

For a specific imaging system, the choice of focal plane array (FPA) receiver element spacing is a design parameter that is a tradeoff between the optics f-number (focal length/ aperture size), receiver-to-receiver antenna coupling/crosstalk, matching of receiver antenna to the optics, and sampling requirements at the image plane. Resolution is increased by reducing the receiver pixel spacing. However, empirical data from extensive experimentation in MMW cameras show unacceptable levels of receiver performance degradation due to coupling between the antennas of neighboring pixels with spacing less than 1.5ζ. Advantageously, the features described herein provide for spacing of 1.5λ.

From a fabrication standpoint, the distance between individual chips within a single pixel may be reduced to be much less than the pixel-to-pixel distance. With batch fabricated receiver antennas, fabricating a receiver spacing of 1.5λ is no more challenging than for 3λ. From a practical standpoint, an upper limit of spacing is defined by setting the FPA size equal to or less than the diameter of the optical aperture. In order to reach Nyquist sampling, the receiver spacing must be kept under ~2.5λ to keep the FPA size less than the aperture diameter, assuming a square FPA with 1024 elements. However, in order to improve the imaging resolution, a larger aperture should be used, which corresponds to the smallest spacing of 1.5λ. In the FPA described above (4.2× 4.2 cm²), the optical aperture diameter increases to ~15 cm for Nyquist sampling, corresponding to a resolution of 2.2 cm at a distance of 3 meters for a 30 cm focal length imager. For a more compact system, such as for a manportable imager, the focal length could be reduced to 16 cm, dropping the aperture to 6.5 cm for Nyquist sampling, paying a cost in resolution (2.2 to 5 cm) at 3 m. For other missions, different imaging requirements will dictate different optics, and consequently different sized cameras.

9. Fabrication of Additional Metal on Waveguide Layer 104 or Antenna Layer 106.

Micromachined waveguides (WG) use deep trenches in wafers to form a WG cavity. A trench wafer with WG trenches is often integrated with one or more additional wafers to complete the WG. For example, a trench wafer may be integrated with a cover wafer and/or a bottom wafer to seal the WG cavity. Additional processing and/or patterning may be needed after formation of the trench in the trench wafer. For example, the trench wafer may also need to integrate with chips placed inside the WG cavity.

In one example, the wafer integration requires that the trench wafer is patterned for deposition of a bonding layer (such as indium) between the trench wafer and the cover wafer. The bonding layer may be selected to accommodate other design considerations for the WG. However, when the trench depth is approximately 30-50 μm or more, a wet photoresist (PR) may not be suitable for patterning after formation of the trench, particularly near the trench edge. For example, a wet PR may not adequately cover trench sidewalls that are approximately 200 μm or more in height. In another example, additional processing may be needed inside of the trench, for example, solder pads and/or metal lines that run from the wafer top surface into the trench. Experiments have shown these patterns are difficult to achieve using wet PR.

Figure 12:
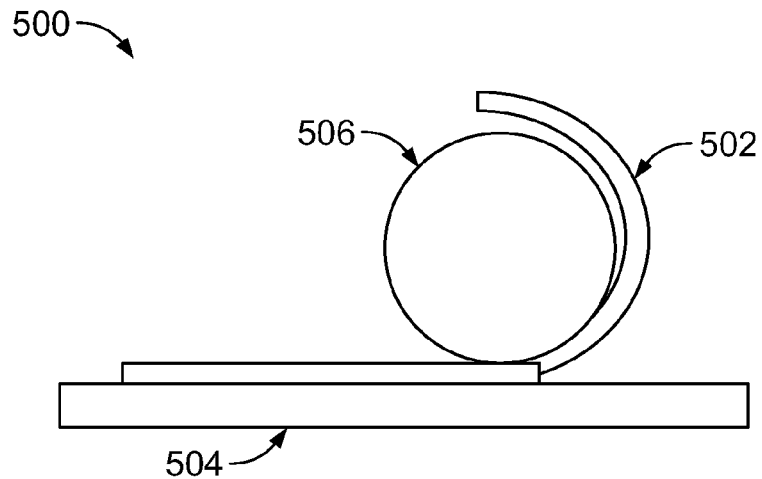
FIG. 12 graphically represents a system for application of dry photoresist to a substrate.

Dry photoresists (dry PRs) are also available for processing wafers. Dry PR has been used as a cap material to block trenches in wafers. Turning to FIG. 12, one implementation of a system 500 is adapted for application of a dry photoresist 502 to a substrate or wafer 504. The system 500 comprises a roller 506 for applying the dry PR 502. The roller 506 in one example is adapted to provide heat and/or pressure to promote application of the dry PR 502 to the wafer 504. In one example, the roller 506 is heated to 120° C.

The system 500 in one example is adapted to pattern the top surface of a wafer directly with dry PR. The system 700 may be further adapted to use dry PR for patterning adjacent to and also within a wafer trench. In contrast to the spin-coating process used for wet PR, dry PR is a solid film which may be laminated on a wafer surface, therefore avoiding the PR coverage and thickness variation issues presented by wet PR. The thickness of dry PR can vary between approximately 11 μm to more than 100 μm.

Figure 13:
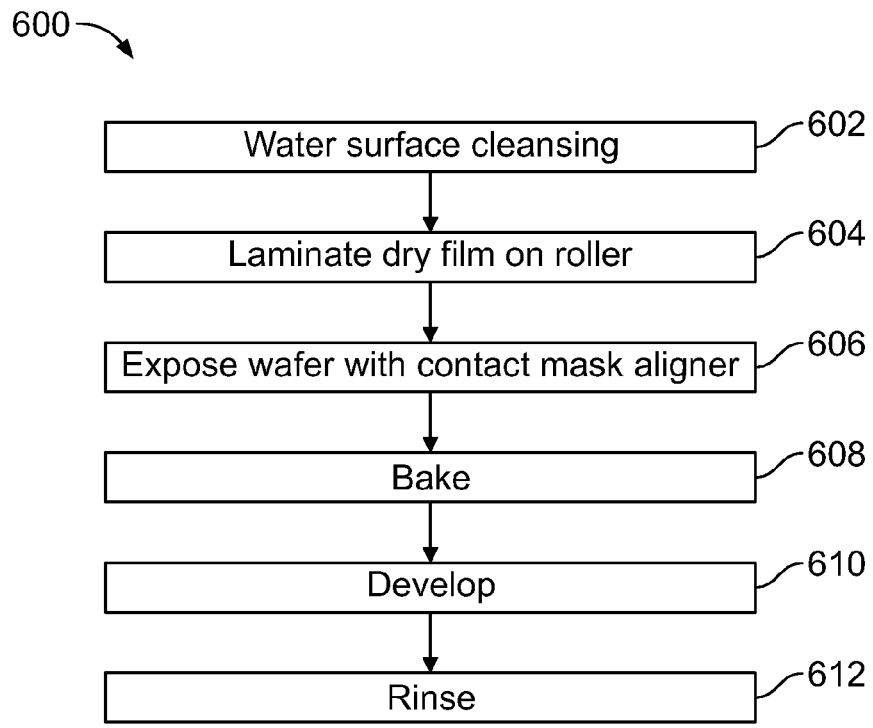
FIG. 13 is a flowchart illustrating the steps involved in patterning deep trenches using a dry photoresist.

Turning to FIG. 13, a method 600 illustrates one implementation for patterning near deep trenches using a dry PR. The surface of the wafer is cleaned (STEP 602), for example, using known solvents. The dry PR 702 is laminated onto the wafer 504 by the roller 506 (STEP 604). The dry PR 502 in one example comprises Dupont MM100 resist, which allows for a resolution of approximately 50 μm. Other examples of dry PR will be apparent to those skilled in the art. The roller 506 in one example is heated to 120° C. to promote the lamination. Alternative temperatures for the roller 506 may be selected, for example, based on the dry PR used or speed of the roller.

The wafer is exposed (STEP 606) with a contact mask aligner. The contact mask aligner in one example has a power of 150 mW and exposure lamp wavelength at 365 nm. Other contact mask aligners may be selected, for example, based on the dry PR used, the complexity of the patterns, or other design considerations. After exposing, the wafer in one example is baked (STEP 608) to improve pattern resolution. Baking may be performed using a hotplate bake at 90° C. for approximately 60 seconds. Alternative methods of heating the wafer or alternative temperatures and durations will be apparent to those skilled in the art. The wafer is then developed (STEP 610). In one example, the wafer is spray developed for approximately 90 seconds with a potassium carbonate solution. The solution in one example is $K_2CO_3$, 1.0 wt %. The duration and solution for developing may be adjusted based on design considerations. The wafer is then rinsed (STEP 612) to remove post develop residue, for example, using a deionized water spray.

The dry PR 502 in one example is a negative resist and thus more suitable for creating the sidewall profile for metal evaporation and liftoff. The thickness of the dry PR 502 is approximately 38 μm, which can resolve features as small as 40-50 μm. For smaller features, thinner dry PR can be used. Dry PR adhesion to certain surfaces may need to be enhanced. For example, dry PR adhesion to a Au surface is reduced as compared to a silicon surface. The adhesion can be improved with surface treatment (ex., roughing the surface, or using some surface promoter). Additional mask features may be incorporated to enhance the dry PR adhesion and suspension to an Au top surface.

Figure 14:
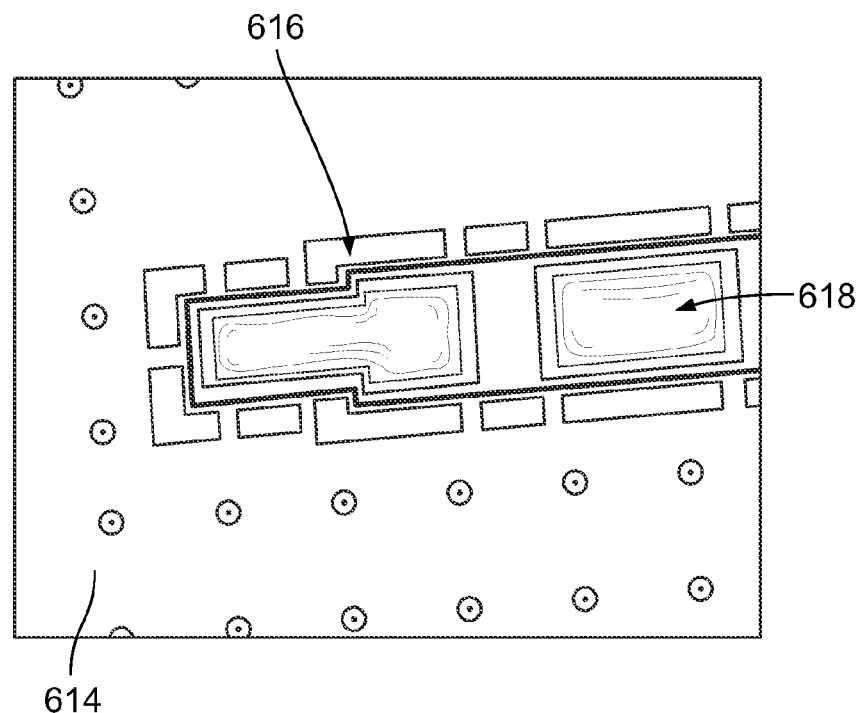
FIG. 14 depicts a wafer processed using dry photoresist.

Turning to FIG. 14, one example of a wafer 614 is shown that has been processed using the dry photoresist application of FIG. 12. In this example, non-continuous opening lines were used to enhance the dry PR suspension. A dry photoresist opening is shown at 616. A trench 618 is shown covered by the dry PR. In one example, an indium layer is patterned into opening 616 over a gold layer to form a bonding layer. The bonding layer may then be bonded with another wafer, as will be appreciated by those skilled in the art.

Figure 15:
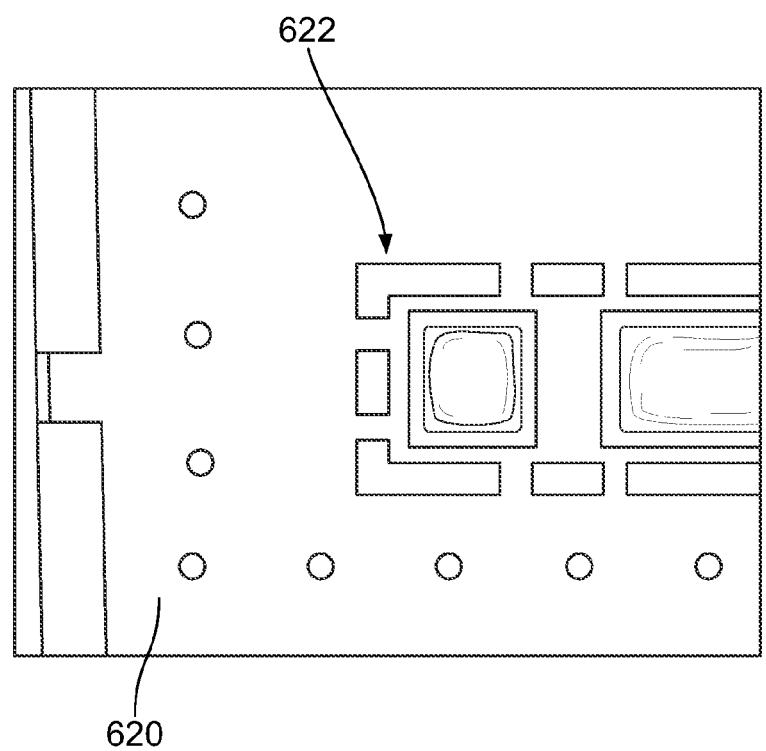
FIG. 15 depicts the wafer of FIG. 14 after further processing.

Turning to FIG. 15, one example of a wafer 620 is shown after indium evaporation and lift off at area 622.

Alternative steps and fabrication features will be apparent to those skilled in the art. For example, the horn antenna may be formed prior to formation of the cavities on the backside of the antenna layer 106, as will be appreciated by those skilled in the art.

The steps or operations described herein are just for example. There may be many variations to these steps or operations without departing from the spirit of the invention. For instance, the steps may be performed in a differing order, or steps may be added, deleted, or modified.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A pixel for a sub-millimeter wavelength (SMMW) imaging system using a focal plane array (FPA), each pixel of said FPA comprising:
   a chip interface layer comprising one or more DC through vias, and one or more solder balls on the upper surface of the chip interface that are coupled with the one or more DC through vias;
   a waveguide layer comprising one or more rectangular waveguide cavities said waveguide layer having a lower surface operatively connected to the upper surface of the chip interface layer such that the rectangular waveguide cavities are aligned with the solder balls;
   one or more monolithic microwave integrated circuit (MMIC) chips attached to the one or more solder balls on the chip interface layer and electromagnetically coupled to the one or more rectangular waveguide cavities in the waveguide layer; and
   an antenna layer operatively coupled to an upper surface of the waveguide layer such that an antenna is aligned with at least one of the rectangular waveguide cavities;
   wherein SMMW signals are received through the antenna, transmitted through the rectangular waveguide cavities and processed by the MMIC chips.

2. The pixel of claim 1 wherein the chip interface is manufactured from a wafer and the waveguide and antenna are manufactured from one or more wafers.

3. The pixel of claim 2 wherein the chip interface wafer and the one or more waveguide and antenna wafers are integrated using a wafer scale packaging techniques.

4. The pixel of claim 1 wherein the antenna is a horn antenna.

5. The pixel of claim 1 where in the MMIC chips further comprise one or more low noise amplifiers (LNA) and one or more diodes.

6. The pixel of claim 1 wherein the chip interface, the waveguide, the antenna and the MMIC chips are each fabricated separately.

7. The pixel of claim 1 wherein the MMICs are tested for operability and only known-good chips are placed into the rectangular waveguide cavities.

8. A sub-millimeter wavelength (SMMW) imaging system using a focal plane array (FPA), said FPA comprising;
   a first layer comprising a plurality of electrical connections from one side of the first layer to the other side;
   a second layer comprising a plurality of rectangular waveguide cavities, a surface of the second layer operatively coupled with the first layer so that the rectangular waveguide cavities are aligned with the electrical connections of the first layer;
   a plurality of monolithic microwave integrated circuits (MMICs) chips inserted into the plurality of rectangular waveguide cavities so that each MMIC chip is electromagnetically coupled to at least one of the rectangular waveguide cavities in the second layer and operatively connected with at least one of the electrical connections of the first layer; and
   a third layer comprising a plurality of antennas, a surface of the third layer operatively coupled to the second layer so that said plurality of antennas are aligned with said plurality of waveguide cavities, each of said plurality of antennas receiving SMMW radiation and transferring it to at least one MMIC chip through at least one rectangular waveguide cavity.

9. The FPA of claim 8 wherein the MMIC chips further comprise low noise amplifiers (LNA) and diodes.

10. The FPA of claim 9 wherein the first, second, third layers and the MMIC chips are each fabricated separately.

11. The FPA of claim 9 wherein the MMIC chips are fabricated from III-V semiconductor material and the first, second and third layers are batch processed.

12. The FPA of claim 8 wherein the first, second and third layers are assembled using wafer scale assembly (WSA) techniques.

* * * * *